United States Patent
Guo et al.

(10) Patent No.: US 11,709,985 B2
(45) Date of Patent: Jul. 25, 2023

(54) SEMICONDUCTOR DEVICE INCLUDING STANDARD CELLS WITH COMBINED ACTIVE REGION

(71) Applicant: TAIWAN SEMICONDUCTOR MANUFACTURING COMPANY LTD., Hsinchu (TW)

(72) Inventors: Ta-Pen Guo, Taipei (TW); Guru Prasad, Austin, TX (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 288 days.

(21) Appl. No.: 17/074,450

(22) Filed: Oct. 19, 2020

(65) Prior Publication Data

US 2021/0224458 A1    Jul. 22, 2021

Related U.S. Application Data

(60) Provisional application No. 62/964,296, filed on Jan. 22, 2020.

(51) Int. Cl.
| | |
|---|---|
| *G06F 30/39* | (2020.01) |
| *G06F 30/392* | (2020.01) |
| *H01L 23/50* | (2006.01) |
| *G03F 1/70* | (2012.01) |

(52) U.S. Cl.
CPC .............. *G06F 30/392* (2020.01); *G03F 1/70* (2013.01); *H01L 23/50* (2013.01)

(58) Field of Classification Search
CPC ........ G06F 30/392; G06F 30/394; G06F 1/70; G06F 2119/06; G06F 30/39; H01L 27/0207; H01L 27/092; H01L 27/11807; H01L 27/0924; H01L 2027/11881; H01L 21/823821; H01L 1/823871; H01L 2027/11875; H01L 23/50; H01L 23/528; H01L 23/5286; H01L 21/823871; G03F 1/70
USPC ......................................................... 716/120
See application file for complete search history.

(56) References Cited

U.S. PATENT DOCUMENTS

| | | | | |
|---|---|---|---|---|
| 7,821,039 | B2 * | 10/2010 | Tien ...................... | H01L 27/092 257/532 |
| 10,141,296 | B2 * | 11/2018 | Hsieh .................. | H01L 29/6681 |
| 10,380,315 | B2 * | 8/2019 | Zhuang ................. | G06F 30/398 |
| 10,726,186 | B2 * | 7/2020 | Kim ....................... | G06F 30/392 |
| 10,867,114 | B2 * | 12/2020 | Zhuang ............. | H01L 27/11807 |

(Continued)

*Primary Examiner* — Paul Dinh
(74) *Attorney, Agent, or Firm* — WPAT Law; Anthony King

(57) ABSTRACT

A semiconductor device includes a first and a second power rails extending in a row direction, a third power rail extending in the row direction between the first and second power rail, and a first cell arranged between the first second power rails. A cell height of the first cell in a column direction perpendicular to the row direction is equal to a pitch between the first and second power rails. The semiconductor device also includes a second cell arranged between the first and third power rails. A cell height of the second cell in the column direction is equal to a pitch between the first and third power rails. A first active region of the first cell includes a first width in the column direction greater than a second width, in the column direction, of a second active region in the second cell.

20 Claims, 9 Drawing Sheets

(56) References Cited

U.S. PATENT DOCUMENTS

| | | | |
|---|---|---|---|
| 11,152,348 B2* | 10/2021 | Sio | G06F 30/30 |
| 11,188,704 B2* | 11/2021 | Kim | G06F 30/392 |
| 11,270,057 B1* | 3/2022 | Yang | G06F 30/398 |
| 11,282,829 B2* | 3/2022 | Sio | H01L 27/0924 |
| 11,348,918 B2* | 5/2022 | Kim | H01L 23/5286 |
| 2008/0023792 A1* | 1/2008 | Liu | G06F 30/392 |
| | | | 257/532 |
| 2017/0352650 A1* | 12/2017 | Azmat | H01L 23/5286 |
| 2018/0096092 A1* | 4/2018 | Kim | G06F 30/394 |
| 2018/0365368 A1* | 12/2018 | Do | G06F 30/392 |
| 2019/0164949 A1* | 5/2019 | Sio | H01L 27/0207 |
| 2019/0393205 A1* | 12/2019 | Lee | G06F 30/394 |
| 2020/0134128 A1* | 4/2020 | Peng | H01L 23/535 |
| 2020/0151298 A1* | 5/2020 | Kim | G06F 30/392 |
| 2020/0357786 A1* | 11/2020 | Sio | H01L 27/0924 |
| 2020/0402968 A1* | 12/2020 | Zhuang | H01L 23/5286 |
| 2021/0057411 A1* | 2/2021 | Kim | H01L 27/092 |
| 2021/0097225 A1* | 4/2021 | Zhuang | G06F 30/398 |
| 2021/0125926 A1* | 4/2021 | Le Bars | H01L 23/528 |
| 2021/0143800 A1* | 5/2021 | Lee | H01L 27/0924 |
| 2021/0193657 A1* | 6/2021 | Kim | H01L 29/66666 |
| 2021/0193683 A1* | 6/2021 | Yang | G06F 30/392 |
| 2021/0224457 A1* | 7/2021 | Guo | H01L 23/5286 |
| 2021/0343696 A1* | 11/2021 | Chae | H01L 23/5286 |
| 2021/0374323 A1* | 12/2021 | Zhuang | H01L 27/0207 |
| 2022/0058326 A1* | 2/2022 | Lee | G06F 30/392 |
| 2022/0067259 A1* | 3/2022 | Wang | H01L 29/41775 |
| 2022/0102363 A1* | 3/2022 | Xiao | H01L 27/1116 |
| 2022/0123023 A1* | 4/2022 | Peng | H01L 27/124 |
| 2022/0246599 A1* | 8/2022 | Chang | H01L 29/42392 |

* cited by examiner

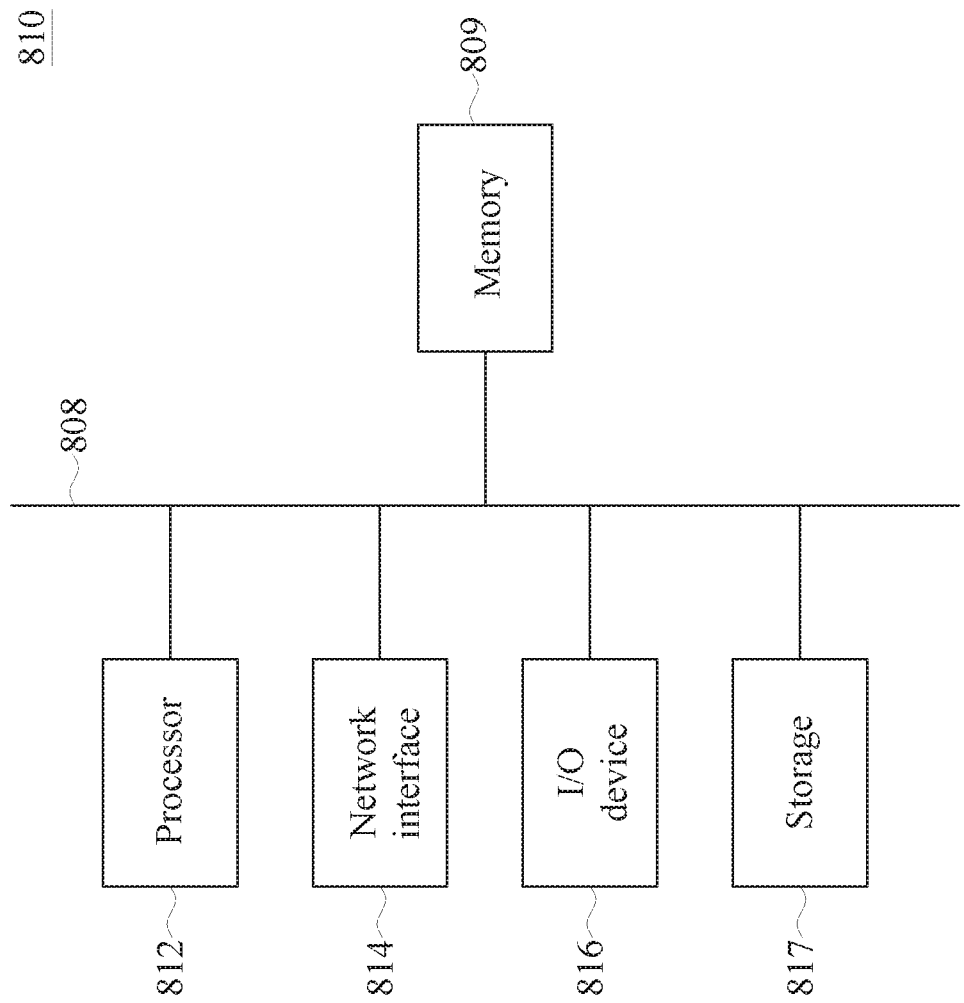

SEMICONDUCTOR DEVICE INCLUDING STANDARD CELLS WITH COMBINED ACTIVE REGION

PRIORITY CLAIM AND CROSS-REFERENCE

This application claims priority to U.S. Provisional Application No. 62/964,296 filed Jan. 22, 2020, the disclosure of which is hereby incorporated by reference in its entirety.

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection and low testing coverage. Therefore, there is a continuous need to modify the structure and manufacturing method of the devices in electronic equipment in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 8B is a schematic diagram of a design subsystem in the IC manufacturing system shown in FIG. 8A for generating a design layout, in accordance with some embodiments.

DETAILED DESCRIPTION

Figure 1:
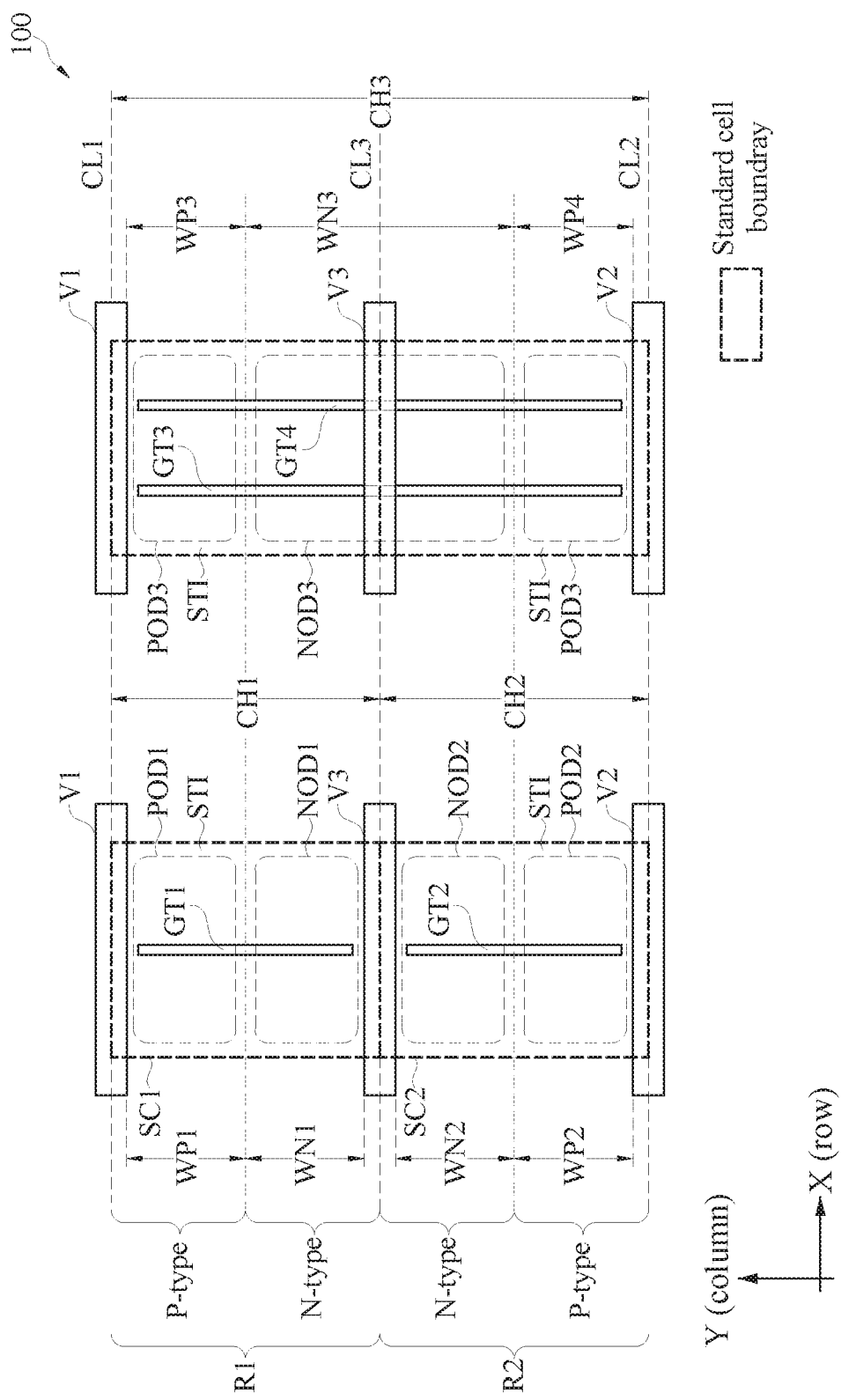
FIG. 1 is a schematic diagram of a design layout, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of various patterns in one or more layers and may be expressed as unions of polygons. A design layout may be initially constructed by an array of identical or different standard cells during the layout design stage. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor circuit manufacturers or designers.

FIG. 1 is a schematic diagram of a design layout 100, in accordance with some embodiments. The design layout 100 may be related to or part of a semiconductor device, e.g., a complementary metal-oxide-semiconductor (CMOS) device, and can be implemented using a planar field-effect transistor (FET) device, a fin-type FET (FinFET) device, a gate-all-around (GAA) device, a nanowire device, a fully-depleted silicon-on-isolator (FDSOI) device, or the like.

Referring to FIG. 1, the design layout 100 includes a plurality of standard cells, for example, a standard cell SC1, a standard cell SC2 and a standard cell SC3. As shown in FIG. 1, the design layout 100 includes a first row R1 and a second row R2. The standard cell SC1 and the standard cell SC2 are arranged in rows R1 and R2, respectively, and the standard cell SC3 spans the rows R1 and R2. Although FIG. 1 shows only two standard cells in one row, e.g., the standard cell SC1 and the standard cell SC3 arranged in the first row R1, the number of standard cells arranged in one row may be greater than two. Further, in the depicted embodiment, the standard cell SC3 is separated from the standard cell SC1 and the standard cell SC2. In some other embodiments, the standard cell SC3 is in contact with the standard cell SC1 or the standard cell SC2. As explained below, multiple rows of the standard cells may be arranged in a column direction or in a direction along the y-axis (perpendicular to a row direction or a direction along the x-axis) in the design layout 100.

As shown in FIG. 1, the standard cells SC1 and SC2 include a first power rail V1 and a second power rail V2, respectively, for supplying a first voltage. The first power rail V1 and the second power rail V2 are arranged on an upper side of the standard cell SC1 and a lower side of the standard cell SC2, respectively, and face away from each other. The standard cells SC1 and SC2 further share a third power rail V3 for supplying a second voltage different from the first voltage. In some embodiments, the third power rail V3 is arranged over the abutting sides of the standard cell SC1 and the standard cell SC2. In some embodiments, the standard cell SC1 abuts the standard cell SC2 at a side aligned with a center line CL3 of the third power rail V3. In some embodiments, the first voltage is set at VDD (a positive voltage) and the second voltage is set at VSS (e.g., ground). In some embodiments, the power rails V1, V2 and V3 are formed by metal lines disposed in a metal line layer (see FIG. 4) of the respective standard cells SC1, SC2 and SC3.

In some embodiments, a row height of the first row R1 is defined as a distance in the column direction between a center line CL1, extending in the row direction, of the first power rail V1 and the center line CL3, extending in the row direction, of the third power rail V3. In some embodiments, a cell height CH1 is determined based on a pitch between the first power rail V1 and the third power rail V3. Similarly, a row height of the second row R2 is defined as a distance in the column direction between a center line CL2, extending in the row direction, of the second power rail V2 and the center line CL3 of the third power rail V3. In some embodiments, the row height of the second row R2 is determined based on a pitch between the second power rail V2 and the third power rail V3. In some embodiments, the row height of the first row R1 is the same as or different from the row height of the second row R2.

In some embodiments, the cell height CH1 of the standard cell SC1 is determined based on the row height of the first row R1. In some embodiments, the cell height CH1 is determined based on a pitch between the first power rail V1 and the third power rail V3. In some embodiments, the cell height CH1 is equal to the row height of the first row R1 in which the standard cell SC1 resides.

Similarly, a cell height CH2 of the standard cell SC2 is determined based on the row height of the second row R2. In some embodiments, the cell height CH2 is determined based on a pitch between the second power rail V2 and the third power rail V3. In some embodiments, the cell height CH1 is the same as or different from the cell height CH2. In some embodiments, the cell height CH2 is equal to the row height of the second row R2 in which the standard cell SC2 resides.

As described above, the third power rail V3 is shared by the standard cell SC1 and the standard cell SC2. One of ordinary skill in the art should understand that the design layout 100 may include one or more standard cells arranged in one row immediately above the standard cell SC1 (or below the standard cell SC2) and sharing the first power rail V1 (or the second power rail V2) with the standard cell SC1 (or the standard cell SC2).

As described above, in some embodiments, the third power rail V3 is arranged between the power rails V1 and V2, wherein the third power rail V3 supplies the second voltage and the power rails V1 and V2 supply the first voltage. As such, the standard cells SC1 and SC2 are referred to herein as first-type standard cells, in which the cell height CH1 or CH2 is defined as a distance between the first power rail V1 (or the second power rail V2) that supplies the first voltage and the third power rail V3 that supplies a second voltage. In some embodiments, the first-type standard cell is not divided by any of the power rails V1, V2 or V3.

In some embodiments, the standard cell SC1 or SC2 includes active regions, also referred to herein as oxide-definition ("GD") regions, such as a P-type active region POD1 or POD2 and an N-type region NOD1 or NOD2. The active region may be used to form source/drain regions and channel region between the source/drain regions of a FET device. In some embodiments, the N-type active region NOD1 or NOD2 is a semiconductor intrinsic region (such as silicon) doped with N-type impurities, such as arsenic, phosphorus, or the like. In some embodiments, the P-type active region POD1 or POD2 is a semiconductor intrinsic region doped with P-type impurities, such as boron or the like. The active regions are laterally surrounded and defined by isolation structures, such as a shallow trench isolation structure STI. In some embodiments, the isolation structure STI is formed of dielectric materials, such as oxide, nitride, oxynitride, silicon dioxide, nitrogen-bearing oxide, nitrogen-doped oxide, silicon oxynitride, polymer, or the like.

In some embodiments, the P-type active region POD1 and the N-type active region NOD1 of the standard cell SC1 have substantially equal widths in the column direction, i.e., WP1=WN1. Similarly, the P-type active region POD2 and the N-type active region NOD2 of the standard cell SC2 have substantially equal widths in the column direction, i.e., WP2=WN2. In some embodiments, the widths WP1, WN1, WP2 or WN2 are each related to the cell height CH1 or CH2 of the respective standard cell SC1 or SC2.

In some embodiments, adjacent rows, e.g., the first row R1 and the second row R2, are arranged such that the two active regions NOD1 and NOD2, or POD1 and POD2, that have the same conductivity are disposed closer to each other than the active region having opposite conductivity. For example, the N-type active regions NOD1 and NOD2 of the standard cells SC1 and SC2, respectively, are disposed between the two P-type active regions POD1 and POD2 of the standard cells SC1 and SC2. In some embodiments, the N-type active regions NOD1 and NOD2 of the standard cells SC1 and SC2, respectively, are separated by the isolation structures STI of the respective standard cells SC1 and SC2.

The standard cell SC1 further includes a gate electrode GT1 extending in the column direction and disposed over the active regions POD1 and NOD1. Similarly, the standard cell SC2 further includes a gate electrode GT2 extending in the column direction and disposed over the active regions POD2 and NOD2. The active region POD1, POD2, NOD1 or NOD2 and the corresponding gate electrode GT1 or GT2 may be used together for defining a source region, a drain region and a channel region below the respective gate electrode of an FET device. In some embodiments, the gate electrodes GT1 and GT2 are aligned with each other along the column direction. In some embodiments, the gate electrodes GT1 and GT2 are separated. In some embodiments, the gate electrode GT1 or GT2 does not overlap the power rails V1, V2 and V3. In the depicted embodiments, only one gate electrode GT1 or GT2 is formed in the standard cell SC1 or the standard cell SC2. However, other arrangements are also possible, e.g., multiple gate electrodes may be disposed in parallel with a gate pitch along the row direction.

The standard cell SC3 spans the first row R1 and the second row R2. The standard cell SC3 includes a first power rail V1 and a second power rail V2, respectively, for supplying the first voltage. The center line CIA of the first power rail V1 and the center line CL2 of the second power rail V2 are aligned with the upper side and the lower side of the standard cell SC3, respectively. The standard cell SC3 further includes a third power rail V3 for supplying the second voltage. In some embodiments, the width of the third power rail V3 in the column direction overlaps the standard cell SC3. In some embodiments, the power rails V1, V2 and V3 of the standard cell SC3 are aligned with the corresponding power rails V1, V2 and V3 of the standard cells SC1 and SC2. In other embodiments, the power rails V1, V2 and V3 of the standard cell SC3 extend in the row direction and connect to the power rails V1, V2 and V3 of the standard cells SC1 and SC2. In some embodiments, the first voltage is set at VDD (a positive voltage) and the second voltage is set at VSS (e.g., ground).

In some embodiments, a cell height CH3 of the standard cell SC3 is determined based on a distance in the column direction between the center line CL1 of the first power rail V1 and the center line CL2 of the second power rail V2. In some embodiments, the cell height CH3 is determined based on a pitch between the first power rail V1 and the second power rail V2. The standard cell SC3 is referred to herein as a second-type standard cell, in which the cell height CH3 is defined as a distance between the first power rail V1 and the second power rail V2, both supplying the first voltage. Alternatively, the cell height CH3 is defined as a distance between the two power rails supplying the second voltage. In some embodiments, the cell height CH3 is equal to a sum of row heights of the rows R1 and R2 in which the standard cell SC3 resides.

In some embodiments, active regions are formed in the standard cell SC3 for forming FET devices. For example, the standard cell SC3 includes an N-type active region NOD3 and two P-type active regions POD3. In some embodiments, the N-type active region NOD3 is separated from the P-type active regions POD3 by the isolation structure STI. The two P-type active regions POD3 may be arranged in opposite sides of the N-type active region NOD3. In some embodiments, the N-type active region NOD3 extends from the first row R1 to the second row R2 by "gluing" the N-type active regions of the first-type active regions that are similar to the active regions NOD1 and NOD2, and the N-type active region NOD3 intersects the third power rail V3. In some embodiments, the N-type active region NOD3 is symmetric with respect to the third power rail V3. As shown in FIG. 1, the N-type active region NOD3 is between the two P-type active region POD3, and the N-type active region NOD3 has a width WN3 in the column direction greater than a width sum WN1+WN2 of the N-type active regions NOD1 and NOD2 in the column direction. In some embodiments, the width WN3 is greater than twice the width WN1 or greater than twice the width WN2. In some embodiments, a distance between an upper side of the N-type active region NOD1 and a lower side of the N-type active region NOD2 in the column direction is substantially equal to the width WN3 of the N-type active region NOD3.

The upper and lower P-type active regions POD3 of the standard cell SC3 have respective widths WP3 and WP4, respectively, in the column direction. The widths WP3 and WP4 may be equal or different, at least depending upon the row heights of the first row R1 and the second row R2. In some embodiments, if the P-type active region POD1 and the upper P-type active region POD3 are formed in the same row (i.e., the first row R1), the width WP3 is substantially equal to the width WP1. In some embodiments, if the P-type active region POD2 and the lower P-type active region POD3 are formed in the same row (i.e., the second row R2), the width WP2 is substantially equal to the width WP4.

In advanced generations of semiconductor manufacturing, the standard cells are first-type standard cells arranged uniformly across the design layout and their dimensions (at least in the column direction) are continually being reduced to facilitate design and manufacturing of ever-smaller semiconductor devices. However, the uniform and compact standard cells may not fulfill the various requirements of the semiconductor device, e.g., high-speed devices. One common method of increasing the device speed is to increase the area of the effective active region by joining the active regions of multiple standard cells through interconnection wiring. In contrast, through the introduction of the second-type standard cell, the width (area) of the enlarged active region of the second-type standard cell is greater than the width sum (area sum) of the individual active regions of the first-type standard cells by leveraging the space separating the adjacent active regions of abutting first-type standard cells. The enlarged or "glued" active region, e.g., the N-type active region NOD3, may provide improved performance to the CMOS device implemented using the second-type standard cell as compared to that implemented using the interconnected first-type standard cells. In addition, interconnection wirings that are used to otherwise connect the separated active regions of the first-type standard cells can be completely or partly reduced.

In the depicted embodiment, the glued active region NOD3 of the standard cell SC3 is an N-type active region. In some other embodiments, the second-type standard cell SC3 may have a configuration in which the glued active region is a P-type active region and is disposed between two non-glued N-type active regions.

As mentioned above, the standard cell SC1 or SC2 may include one or more gate electrodes GT1 or GT2 over the respective active regions, e.g., NOD1, POD1, NOD2 and POD2. As shown in FIG. 1, the standard cell SC3 includes gate electrodes GT3 and GT4 extending in the column direction and disposed in parallel over the two P-type active regions POD3 and the N-type active region NOD3. The electrode gates GT3 and GT4 may extend across the N-type active region NOD3. In some embodiments, the gate electrode GT3 or GT4 and the third power rail V3 intersect over the active region NOD3.

Figure 2:
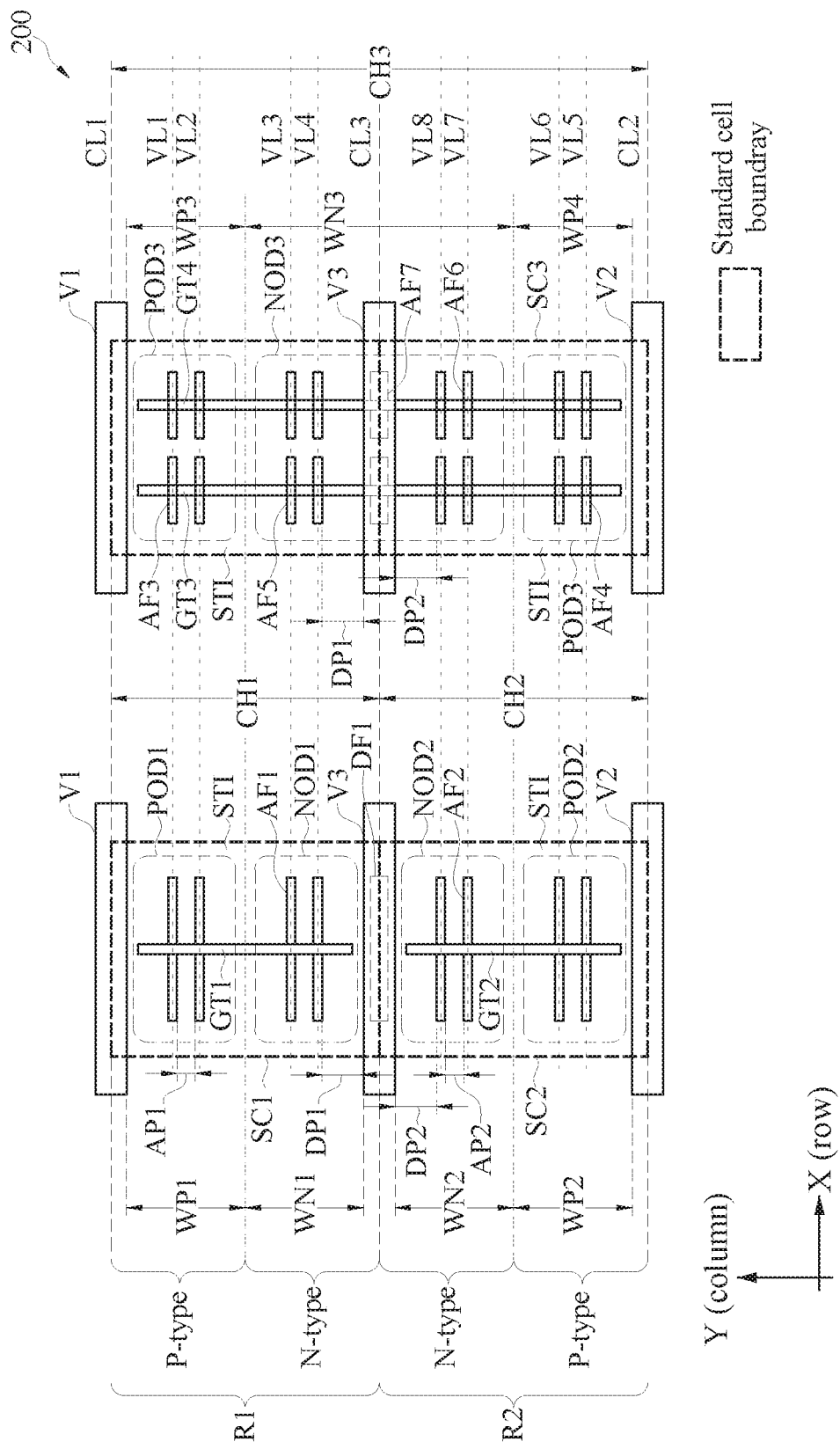
FIG. 2 is a schematic diagram of a design layout, in accordance with some embodiments of the present disclosure.

FIG. 2 is a schematic diagram of a design layout 200, in accordance with some embodiments. The design layout 200 is similar to the design layout 100 in many, aspects, and the semiconductor device implemented by the design layout 200 is formed as FinFET devices in which the active regions in FIG. 2 are supplemented or replaced by fin structures.

Figure 3:
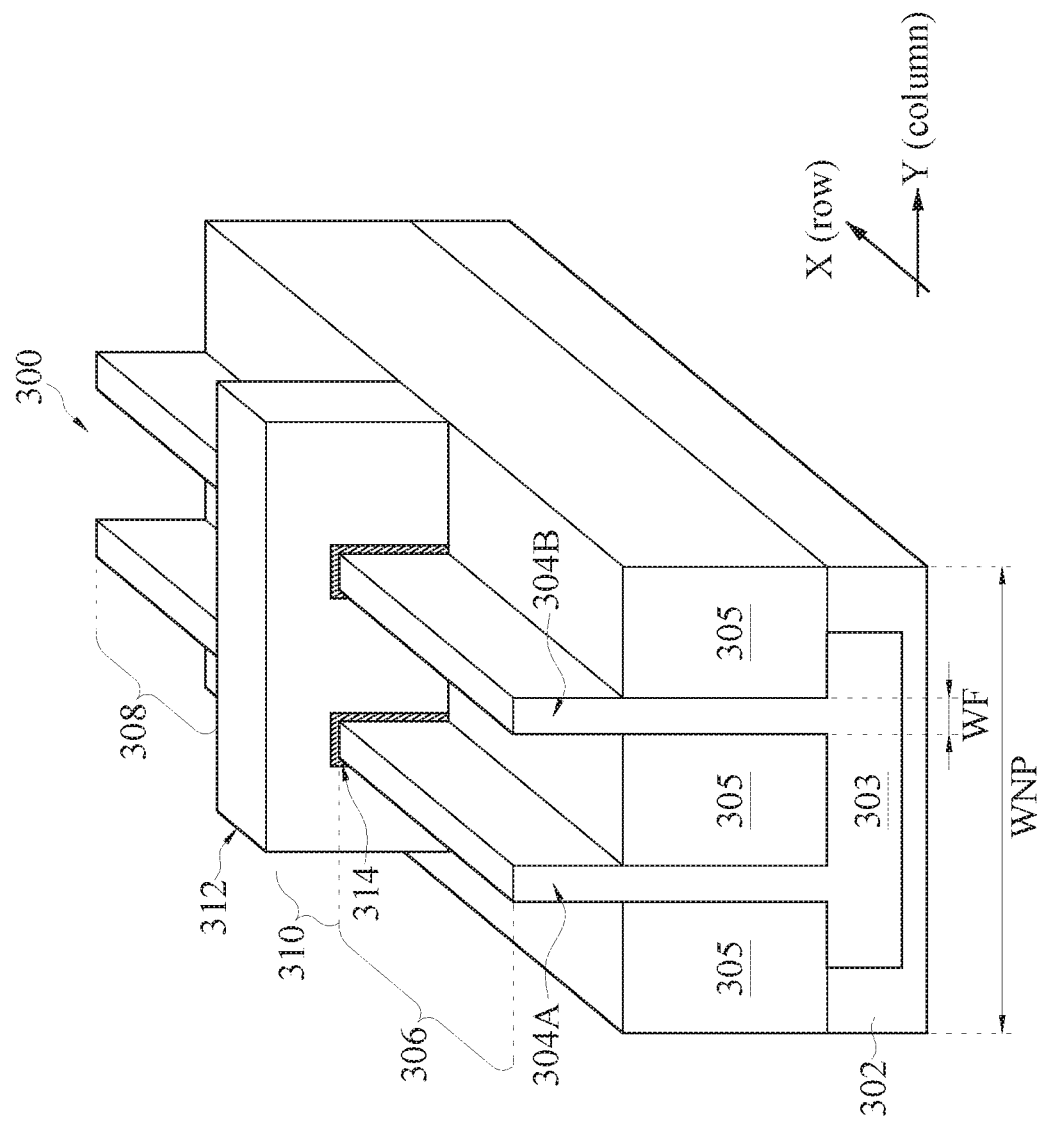
FIG. 3 is a perspective view of a fin field-effect transistor (FinFET) device, in accordance with some embodiments of the present disclosure.

FIG. 3 is a perspective view of a FinFET device 300, according to some embodiments of the present disclosure. In some embodiments, the FinFET device 300 is related to or part of an N-type or P-type active region, such as the active region NOD1, NOD2, NOD3, POD1, POD2 or POD3 in FIG. 2. Referring to FIG. 3, the FinFET device 300 includes a substrate 302, which can be a silicon substrate or other suitable semiconductor substrate. Two exemplary fin structures 304 (e.g., fin structures 304A and 304B), which correspond to fin structures AF1 through AF7 and a dummy fin structure DF1 in FIG. 2, are formed from and protrude from the substrate 302. The fin structures 304A and 304B are parallel to each other and separated by a trench formed in the substrate 302. In some embodiments, the fin structure 304A or 304B is grown by epitaxy. A lower portion of the fin structure 304A or 304B is embedded in an isolation structure 305 (corresponding to the STI of FIGS. 1 and 2), while an upper portion of the fin structure 304A or 304B is exposed through the surface of the isolation structure 305.

The upper portion of each of the fin structures 304A and 304B includes a source region 306, a drain region 308 and a channel region 310 interposed between the source region 306 and the drain region 308. In some embodiments, the source region 306 and the drain region 308 are formed of doped regions and contain impurities having a concentration in a range between about $1\times10^{18}$ and about $1\times10^{20}$ cm$^{-3}$. The channel region 310 may be undoped or lightly doped. In some embodiments, the source region 306 and the drain region 308 are formed by etching the upper portions of the fin structure 304 followed by epitaxially growing semiconductor layers over the etched upper portions.

In some embodiments, a doped region 303 is formed in the substrate 302 below the isolation structure 305. In some embodiments, the doped region 303 extends to a lower portion of each of the fin structures 304A and 304B. In some embodiments, the doped region 303 is an N-type or P-type well region that corresponds to the corresponding N-type active region or P-type active region in the planar FET device of FIG. 1. In some embodiments, the doped region includes a dopant concentration in a range between about $1\times10^{18}$ cm$^{-3}$ and about $6\times10^{18}$ cm$^{-3}$.

A gate electrode 312, which corresponds to the gate electrodes GT1 through GT4 in FIGS. 1 and 2, is formed over the fin structures 304A and 304B. In some embodiments, the gate electrode 312 is made of one or more layers of conductive materials, such as tungsten, cobalt and copper, and may further include other work function adjusting metals, such as Ti, Al, TiAl, TiN, TaC, and the like. The gate electrode 312 extends to cover sidewalk of the channel region 310 and portions of the isolation structure 305. The FinFET device 300 may also include a gate insulating layer 314 between the gate electrode 312 and the channel region 310. The gate insulating layer 314 may be formed of one or more dielectric materials, such as metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and the like.

Referring to FIG. 2, in the standard cell SC1, two fin structures AF1, which extend in the row direction and are parallel to each other in the column direction, are arranged in each of the P-type active region POD1 and the N-type active region NOD1. The gate electrode GT1 is provided over four fin structures AF1 and crosses the isolation structure STI between the P-type active region POD1 and the N-type active region NOD1. Similarly, in the standard cell SC2, two fin structures AF2, which extend in the row direction and are parallel to each other in the column direction, are arranged in each of the P-type active region POD2 and the N-type active region NOD2. The gate electrode GT2 is provided over four fin structures AF2 and crosses the isolation structure STI between the P-type active region POD2 and the N-type active region NOD2. In some embodiments, the fin structures AF1 and AF2 serve as active fin structures for forming one or more FinFET CMOS devices. In some embodiments, the fin structures AF1 and AF2 have pitches P1 and P2, respectively.

In some embodiments, a dummy fin structure DF1 is disposed at the boundary between the standard cell SC1 and the standard cell SC2 and extends in the row direction. In some embodiments, the dummy fin structure DF1 is separated from the gate electrodes GT1 and GT2. The dummy fin structure DF1 may overlap the third power rail V3. In some embodiments, the dummy fin structure MA is not used for forming FinFET CMOS devices. In some embodiments, the dummy fin structure DF1 is electrically isolated from the CMOS device in the design layout 200. In some embodiments, the dummy fin structure DF1 is separated from the adjacent active fin structure AF1 or AF2 by a pitch DP1 or DP2. The pitches DP1 and DP2 may be equal or different.

In the standard cell SC3, four fin structures AF3 extend in the row direction and are arranged in each of the P-type active region POD3, in which two fin structures AF3 are arranged below the gate electrode GT3 and the other two fin structures AF3 are arranged below the gate electrode GT4. Similarly, four fin structures AF4 extend in the row direction and are arranged in each of the lower P-type active regions POD3, in which two fin structures AF4 are arranged below the gate electrode GT3 and the other two fin structures AF4 are arranged below the gate electrode GT4.

Four fin structures AF5 extend in the row direction and are arranged in an upper portion of the N-type active region NOD3, in which two fin structures AF5 are arranged below the gate electrode GT3 and the other two fin structures AF5 are arranged below the gate electrode GT4. Similarly, four fin structures AF6 extend in the row direction and are arranged in a lower portion of the N-type active region NOD3 below the third power rail V3, in which two tin structures AF6 are arranged below the gate electrode GT3 and the other two fin structures AF6 are arranged below the gate electrode GT4. In some embodiments, the fin structures AF3, AF4, AF5 and AF6 serve as active fin structures configured to form one or more FinFET devices.

The standard cell SC3 further includes two fin structures AF7 extending in the row direction between the group of fin structures AF5 and the group of fin structures AF6. Each of the gate electrodes GT3 and GT4 is arranged over one of the fin structures AF7. In some embodiments, the fin structures AF7 serve as active fin structures for forming one or more FinFET CMOS devices together with the fin structures AF5 or AF6. In some embodiments, the fin structures AF7 partially or entirely overlap the third power rail V3. In some embodiments, the dummy fin structure 1 is aligned with the fin structures AF7 in the row direction, e.g., the dummy fin structures DF1 and the active tin structures AF7 are aligned with the center line CL3 of the third power rail V3.

Through the introduction of the additional active fin structures AF7, the N-type active region NOD3 of the standard cell SC3 provides improved FinFET CMOS device performance, such as greater speed or power, as compared to that provided by the interconnected N-type active regions NOD1 and NOD2 of the standard cell SC1 and the standard cell SC2.

In some embodiments, the numbers of the fin structures AF1 through AF7 and their locations in the column direction are predetermined. For example, the fin structures AF1 or AF3 arranged in the P-type active region POD1 or upper POD3 are aligned with one of virtual lines VL1 or VL2 extending in the row direction, and the fin structures AF2 or AF4 arranged in the P-type active region POD2 or lower POD3 are aligned with one of virtual lines VL5 or VL6 extending in the row direction. Likewise, the fin structures AF1 or AF5 arranged in the N-type active region NOD1 or NOD3 are aligned with one of virtual lines VL3 or VL4 extending in the row direction, and the fin structures AF2 or AF6 arranged in the N-type active region NOD2 or NOD3 are aligned with one of virtual lines VL7 or VL8 extending in the row direction.

In some embodiments, each of the fin structures AF1 through AF7 is aligned with one of the virtual lines VL1 through VL8 according to design rules. Accordingly, any two of the fin structures AF1 through AF7 arranged to be aligned with the same virtual line VL1 through VL8 are also aligned with each other in the row direction. For example, the fin structures AF1 in the P-type active region POD1 are aligned with the fin structures AF3 in the upper P-type active region POD3 in the row direction.

In some embodiments, the definition of an active region and its width in the column direction in the scenario of a FinFET device as illustrated in FIG. 2 are different from those in the scenario of a planar FET device as illustrated in FIG. 1. Referring to FIG. 2 and FIG. 3, a width WNP of the well region 303 of the semiconductor device 300 in the column direction corresponds to the width WN1, WP1, WN2 or WP2 of respective active regions in the column direction. Further, FIG. 3 shows a width WF of the fin structure 304A or 304B in the column direction. As described above, the width of a certain active region in the column direction, such as the N-type active regions NOD1 and NOD2 or the P-type active regions POD1 and POD2, is associated with the number of active fin structures arranged therewithin. In some embodiments of the FinFET CMOS device, an N-type or P-type active region is a region having a shape of a polygon including the active fin structures, and a nominal width of this active region in the column direction is equal to a width of its counterpart active region in the column direction for a planar FET device, in which the nominal width may be based in part on the portion of the isolation structures STI between or around the active fin structures. Alternatively, an effective width of this active region in the column direction is determined according to a width sum of the active fin structures formed within the respective active region, and the widths of isolation structures STI between the active fin structures are not taken into consideration. For example, in some embodiments, an effective width WN1 of the N-type active region NOD1 in the standard cell SC1 is the width sum of the two fin structures AF1 in the column direction. In embodiments where the fin structures AF1 have substantially equal widths WF, the effective width WN1 of the N-type active region NOM in the column direction is 2×WF. As such, a width of an N-type or P-type active region containing active fin structures is alternatively defined as the width sum of the active fin structures within the respective active region, or defined as the number of fin structures within the respective active region multiplied by the width of one fin structure given the assumption of equal widths among the fin structures.

As describe above, the nominal width of an active region including multiple consecutive active fin structures may be defined herein as a distance between an upper side of an uppermost active fin structure and a lower side of a lowermost active fin structure among these active fin structures. In other words, the nominal width of an active region including multiple consecutive active fin structures is defined herein as a sum of the fin widths of the active fin structures plus the widths of the isolation structures STI separating these active fin structures. The use of a nominal width in the scenario of FinFET devices provides a convenient way of comparing the area consumption of the so-called active region of the fin-type FET device with its planar-type counterpart. Further, in some embodiments, the result of size comparison of two active regions (equivalently the effective width) including fin structures can be obtained by comparing the nominal widths of the respective active regions given equal fin pitches between the two active regions. Throughout the present disclosure, both the nominal width and effective width can be used to describe a width of an active region, and thus are referred to by the same label. For example, the nominal width and the effective width of the N-type active region of the first standard cell SC1 are referred to by the label "WN1."

Referring to FIG. 2, in some embodiments, the width sum, expressed by WN1+WN2, of the combined N-type active regions NOD1 and NOD2 of the standard cells SC1 and SC2 is four times the width WF of one fin structure, i.e., 4×WF, assuming the fin structures AF1 and AF3 have substantially equal widths WF in the column direction. In contrast, the effective width WN3 of the N-type active region NOD3 is five times the width WF of one fin structure, i.e., 5×WF, given the assumption that the fin structures AF7 have the fin width WF. In some embodiments, the number of active fin structures (AF5+AF6+AF7) in the N-type active region NOD3 is greater than twice the number of the active fin structures AF1 in the N-type active region NOD1 or greater than twice the number of the active fin structures AF2 in the N-type active region NOD2. In some other embodiments, if more than one row of the fin structures AF7 is allowed between the group of fin structures AF5 and the group of fin structures AF6 by, e.g., adjusting the pitch DP1 or DP2, the effective width WN3 of the active region NOD3 in the column direction is increased by the widths of these additional fin structures AF7.

Figure 4:
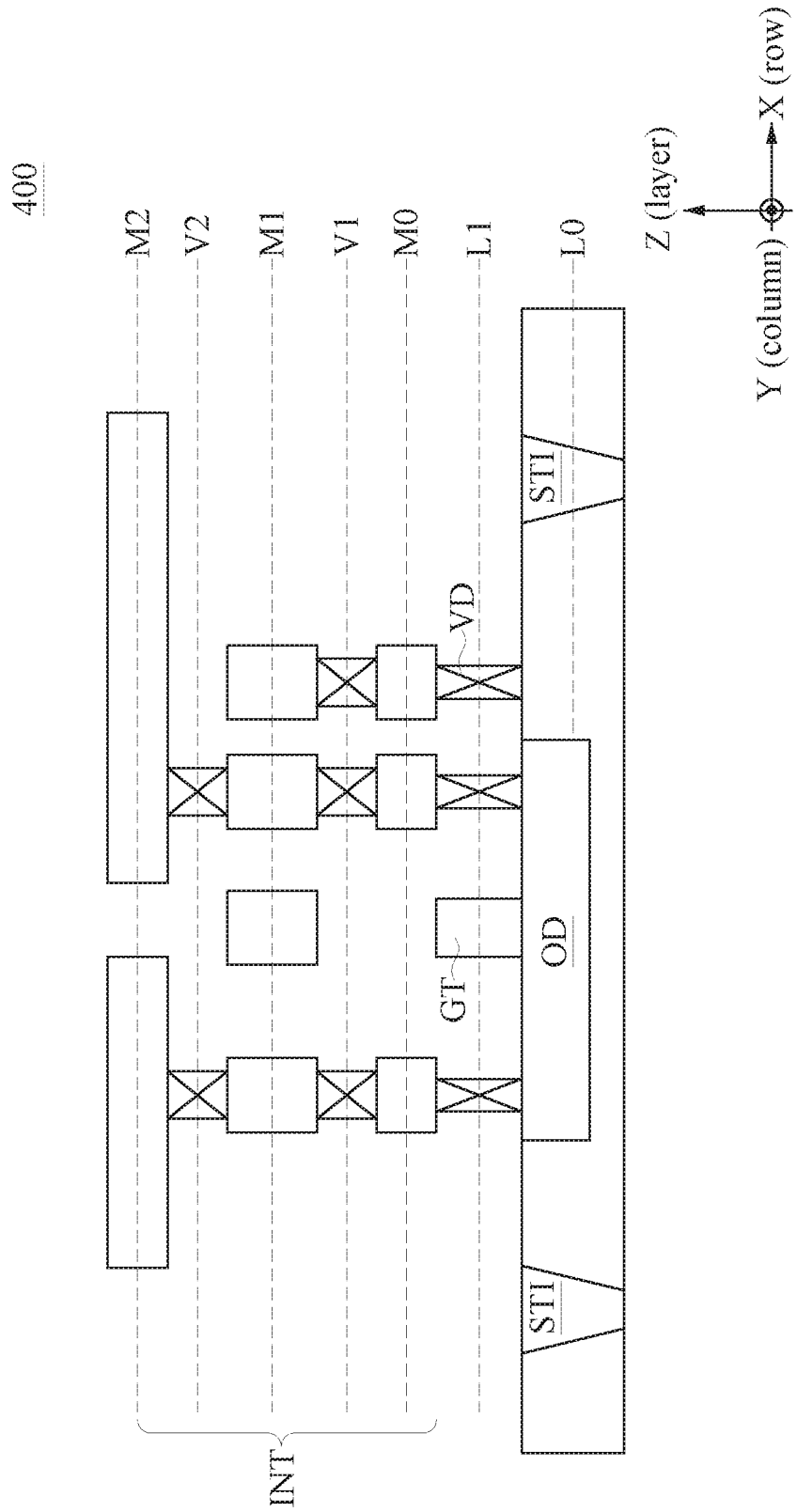
FIG. 4 is a cross-sectional view showing a vertical layer arrangement of a semiconductor device, in accordance with some embodiments of the present disclosure.

FIG. 4 is a cross-sectional view 400 showing a vertical layer arrangement of the semiconductor device in FIGS. 1 and 2, in accordance with some embodiments of the present disclosure.

In some embodiments, an active region OD, which corresponds to the N-type active region NOD1, NOD2 or NOD3, or the P-type active region POD1, POD2, POD3 or POD4, and isolation structures STI are formed in the substrate layer L0. A gate structure including a gate electrode GT, e.g., gate structures GT1 through GT4 in FIGS. 1 and 2, and a gate insulating layer (not separately shown) are formed in a gate layer L1 over the substrate layer L0. In some embodiments, fin structures, e.g., fin structures AF1 through AF7 and the dummy fin DF1 in FIG. 2, are formed in the gate layer or the substrate layer.

In some embodiments, contact vias VD are formed in the gate layer L1 to be electrically coupled to a source region or a drain region in the active region OD. An interconnect structure INT is formed over the gate layer L1 to electrically connect the features in the gate layer L1 and the substrate layer L0 or couple the gate layer L1 and the substrate layer L0 to overlying layers. The interconnect structure INT may comprise multiple metal line layers Mx (where x denotes the layer index) and multiple metal via layers Vx (where x denotes the layer index) alternatingly arranged with the metal line layers Mx. Each metal line layer Mx includes one or more metal lines and each metal via layer Vx includes one or more metal vias. One metal line in a metal line layer Mx is electrically coupled to another metal line in the metal line layer M(x+1) through a corresponding metal via in a metal via layer V(x+1) between the metal line layers Mx and M(x+1). The metal line layers Mx and the metal via layers Vx are made of metal, such as copper, aluminum, tungsten titanium, tantalum, an alloy thereof or the like, and electrically insulated by dielectric materials (not separately shown) such as oxide, nitride, oxynitride and the like. The number of metal line layers Mx and metal via layers Vx are determined according to application requirements, and the configuration of the interconnect structure INT illustrated in FIG. 4 is not intended to be limiting.

In some embodiments, the metal lines in the metal line layers M0 and M1 extend along the y-axis, i.e., the column direction in FIGS. 1 and 2. In some embodiments, the metal lines in the metal line layer M2 extend along the x-axis, i.e., the row direction in FIGS. 1 and 2. In the depicted embodiment, the power rails V1, V2 and V3 are formed by metal lines in the metal line layer M2. However, in other embodiments, the power rails V1, V2 and V3 can be formed by metal lines in another metal line layer.

Figure 5:
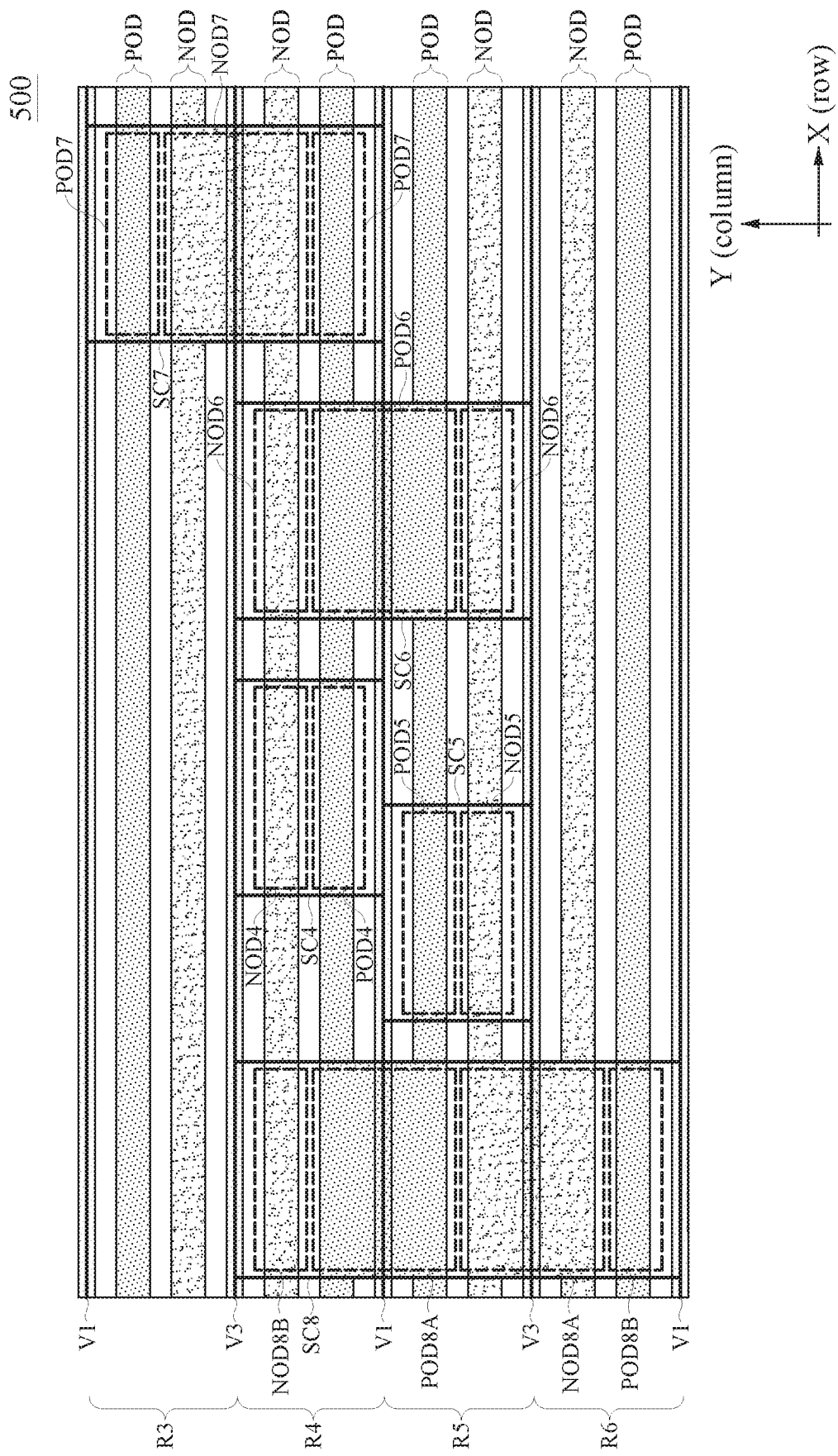
FIG. 5 is a schematic diagram of a design layout, in accordance with some embodiments of the present disclosure.

FIG. 5 is a schematic diagram of a design layout 500, in accordance with some embodiments of the present disclosure. The design layout 500 may be related to or part of a semiconductor device, e.g., a CMOS device, and can be implemented as a planar FET device, a FinFET device, a GAA device, a nanowire device, an FDSOI device, or the like.

Referring to FIG. 5, the design layout 500 includes four rows R3 through R6 extending in the row direction. A plurality of first power rails V1 for supplying the first voltage and a plurality of third power rails V3 for supplying the second voltage are alternatingly arranged and extend in the row direction. Each of the first power rails V1 and the third power rails V3 is arranged on an upper side or a lower side of one of the rows R3 through R6. In some embodiments, the center line of each of the first power rails V1 and the third power rails \3 is aligned with the upper side or lower side of one of the rows R3 through R6.

Each of the rows R3 through R6 includes a pair of active regions NOD and POD having opposite conductivity types and extending in the row direction. In a configuration similar to the design layouts 100 and 200, the orders of the active regions NOD and POD in adjacent rows are interchanged row by row in the design layout 500. For example, two adjacent N-type active regions NOD in the rows R3 and R4 are arranged between the two P-type active regions POD in the rows R3 and R4. Likewise, two adjacent P-type active regions POD in the rows R4 and R5 are arranged between the two N-type active regions NOD in the rows R4 and R5.

The design layout 500 further includes exemplary standard cells SC4, SC5, SC6, SC7 and SC8. The standard cells SC4 and SC5 are arranged in rows R4 and R5, respectively. Each standard cell SC4 through SC8 may have the same or different cell lengths in the row direction. The sizes of the standard cells SC4 through SC8 are defined by their respective cell boundaries, in which each cell boundary includes an upper cell side and a lower cell side (both extending in the row direction) and a left cell side and a right cell side (both extending in the column direction). The standard cells SC4 through SC8 may be separated from one another or share at least one cell side.

In some embodiments, as shown in FIGS. 1, 2 and 5, the standard cells SC1 through SC8 have respective upper cell sides and lower cell sides aligned with the center lines of either the first power rails V1, the second power rails V2 or the third power rails V3, and therefore the standard cells SC1 through SC8 are referred to as "on-grid" standard cells. In other words, the width of an on-grid standard cell in the column direction is defined as the width of an entire row or an aggregation of contiguous rows. The arrangement of the on-grid standard cells in the design layout 500 enables better placement efficiency and area utilization of a cell placement operation.

The standard cells SC4 and SC5 have respective cell heights of one row with configurations similar to those of the standard cell SC1 and the standard cell SC2 in FIGS. 1 and 2, and are categorized as the first-type standard cell. Repeated descriptions thereof are omitted for brevity.

The standard cell SC6 spans rows R4 and R5, and the standard cell SC7 spans rows R3 and R4. The standard cells SC6 and SC7 have configurations similar to those of the standard cell SC3, and are categorized as the second-type standard cell. Repeated descriptions thereof are omitted for brevity.

The standard cell SC8 spans rows R4, R5 and R6. The standard cell SC8 can be deemed as a variant of the second-type standard cell since it includes a glued P-type active region POD8A having a width in the column direction greater than the combined widths of the two non-glued active regions POD in rows R4 and R5. The standard cell SC8 further includes a glued N-type active region NOD8A having a width in the column direction greater than the combined widths of the two non-glued active regions NOD in rows R5 and R6. The P-type active region POD8A extends from the row R4 to the row R5, and the N-type active region NOD8A extends from the row R5 to the row R6. In addition, the standard cell SC8 includes a non-glued P-type active region POD8B and a non-glued N-type active NOD8B, both having a width in the column direction the same as the widths of active regions POD and NOD in rows R4 and R6, respectively, in some embodiments, the glued active regions NOD8A and POD8A are arranged between the non-glued active regions NOD8B and POD8B. The arrangement of the standard cell SC8 along with the glued active regions POD8A and NOD8A enables realization of a semiconductor device providing improved performance given the same size of the standard cells. Although not separately shown, in some embodiments, the standard cell SC8 can be alternatively formed in the rows R3, R4 and R5 with a non-glued P-type active region, a glued N-type active region, a glued P-type active region and a non-glued N-type active region arranged from top to bottom of the alternative standard cell SC8.

The rows R3 through R6 may have the same or different row heights. In embodiments incorporating fin structures, the number of fin structures within the N-type active region NOD of a certain row may be the same as or different from the number of fin structures within the P-type active region POD of the same row. In some embodiments, the non-glued P-type active regions, e.g., POD4 and POD7, which are arranged in a same row R4 and are not used in forming a glued active region, have substantially equal widths or equal numbers of fin structures in the column direction since both of them are defined according to the same active region POD of the row R4. Further, the fin structures in the P-type active region POD4 in the column direction are aligned with the fin structures in the P-type active region POD7.

Similarly, the non-glued N-type active regions, e.g., NOD4 and NOD6, which are arranged in a same row R4 and are not used in forming a glued active region, have substantially equal widths or equal numbers of fin structures in the column direction since both of them are defined according to the same active region NOD of the row R4. Further, the fin structures in the N-type active region NOD4 in the column direction are aligned with the fin structures in the N-type active region NOD6.

In some embodiments, since the glued P-type active regions POD6 and POD8 have upper portions defined according to the P-type active region POD of the row R4, which is a configuration similar to the non-glued P-type active regions POD4 and POD6, the fin structures of the glued P-type active regions POD6 and POD8 that fall within the P-type active region POD of the row R4 are aligned with the corresponding fin structures of the non-glued P-type active region POD4 and POD7 in the row direction. Similarly, the fin structures of the glued N-type active region NOD7 that fall within the N-type active region NOD of the row R4 are aligned with the corresponding fin structures of the N-type active region NOD4 and NOD6.

In the depicted embodiment, the second-type standard cells SC6 and SC7 have a glued P-type active region POD6 and a glued N-type active region NOD7, respectively. One of the glued active regions of the standard cells SC6 and SC7 may help reduce the rising time and the other of the standard cells SC6 and SC7 may help reduce the falling time of the semiconductor device of the design layout 500. Through introduction of the standard cells SC6 and SC7 with equal or comparable numbers of the standard cells SC6 and SC7, e.g., arranged in a signal path of the semiconductor device, both the rising time and the falling time of the semiconductor device can be reduced and the resulting rising time and falling time are kept balanced.

In embodiments where the row R4 and the row R5 have substantially equal row widths, the P-type active region POD6 of the standard cell SC6 is symmetric with respect to the first power rail V1 between the rows R4 and R5. Similarly, in embodiments where the row R3 and the row R4 have substantially equal row widths, the N-type active region NOD7 of the standard cell SC7 is symmetric with respect to the third power rail V3 between the rows R3 and R4. In embodiments where the row R4 and the row R5 have unequal row widths, the P-type active region POD6 of the standard cell SC6 is asymmetric with respect to the first power rail V1 between the rows R4 and R5. Similarly, in embodiments where the row R3 and the row R4 have unequal row widths, the N-type active region NOD7 of the standard cell SC7 is asymmetric with respect to the third power rail V3 between the rows R3 and R4.

Figure 6:
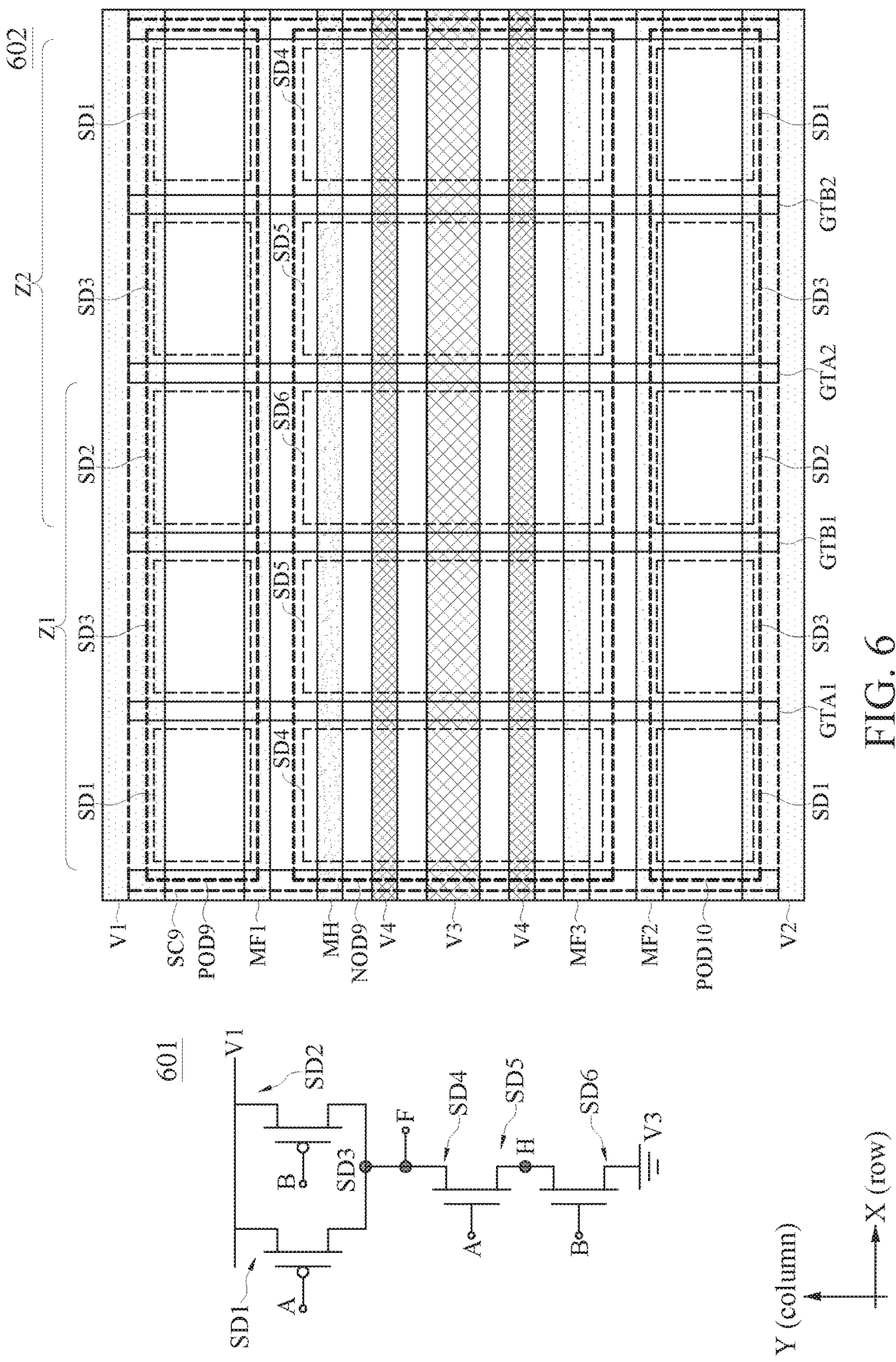
FIG. 6 is a circuit diagram and a schematic layout of a semiconductor device, in accordance with some embodiments of the present disclosure.

FIG. 6 is a circuit diagram 601 and a design layout 602 of a standard cell SC9, in accordance with some embodiments of the present disclosure. In the depicted embodiments, the standard cell SC9 is used for implementing a two-input NAND gate. The circuit diagram 601 and the design layout 602 for implementing the NAND gate are illustrated at the left side and right side, respectively, of FIG. 6. The circuit diagram 601 shows a first input port A, a second input port B, and an output port F of the two-input NAND gate.

Referring to the design layout 602 of FIG. 6, the standard cell SC9 includes two non-glued P-type active regions POD9 and POD10 and one glued. N-type active region NOD9 between the P-type active regions POD9 and POD10. Further, the N-type active region NOD9 spans the rows R1 and R2. In some embodiments, the standard cell SC9 is a second-type standard cell.

Referring to FIG. 4 and FIG. 6, in some embodiments, the first power rail V1 extends in the row direction at a metal line layer M2 over the P-type active region POD9. Similarly, the second power rail V2 extends in the row direction at the metal line layer M2 over the P-type active region POD10.

The design layout 602 further includes gate electrodes GTA1, GTA2, GTB1 and GTB2 extending in the column direction. As such, the design layout 602 can be partitioned into four NAND modules according to the rows R1, R2 and the zones Z1 and Z2. Each of the four NAND modules is configured to implement the function of the NAND gate by itself and the four NAND modules are electrically coupled to one another for providing an integrated NAND gate device with enhanced performance, such as device speed.

Taking a first NAND module defined by the row R1 and the zone Z1 as an example, referring to the circuit diagram 601 and the design layout 602, the P-type active region POD9 and the gate electrode GTA1 define source/drain regions SD1 and SD3 in the P-type active region POD9, the P-type active region POD9 and the gate electrode GTB1 define source/drain regions SD3 and SD2 in the P-type active region POD9, the N-type active region NOD9 and the gate electrode GTA1 define source/drain regions SD4 and SD5, and the N-type active region NOD9 and the gate electrode GTB1 defines source/drain regions SD5 and SD6.

Features serving the same function and distributed in different NAND modules are electrically connected to one another through the interconnect structure INT as illustrated in FIG. 4. For example, the source/drain regions SD1 and SD2 in the P-type active region POD9 are electrically coupled to the first power rail V1 through a metal via (not separately shown) in the metal via layer V0 or a metal line (not separately shown) in the metal line layer M1. Similarly, the source/drain regions SD1 and SD2 in the P-type active region POD10 are electrically coupled to the first power rail V2 through another metal via (not separately shown) in the metal via layer V0 or a metal line (not separately shown) in the metal line layer M1.

In some embodiments, the source/drain regions SD3 in the P-type active region POD9 are electrically coupled to one another through a metal line MF1 extending in the row direction in the metal line layer M2. Similarly, the source/drain regions SD3 in the P-type active region POD10 are electrically coupled to one another through a metal line MF2 extending in the row direction in the metal line layer M2. Further, the source/drain regions SD4 in the N-type active region NOD9 are electrically coupled to one another through a metal line MF3 extending in the row direction in the metal line layer M2. In some embodiments, the metal lines MF1, MF2 and MF3 are electrically coupled to one another, corresponding to the output port F of the circuit diagram 601.

In some embodiments, the source/drain regions SD4 and SD5 in the N-type active regions NOD9 are electrically coupled to one another through a metal line MH extending in the row direction in the metal line layer M2, in which the metal line MH corresponds to a node H of the circuit diagram 601.

In some embodiments, the source/drain regions SD6 in the N-type active region NOD9 are electrically coupled to the third power rail V3 through another metal via (not separately shown) in the metal via layer V0 or a metal line (not separately shown) in the metal line layer T1. The design layout 602 further includes a fourth power rail V4 and a fifth power rail V5 extending in the row direction over the N-type active region NOD9. The power rails V3, V4 and V5, collectively referred to as a variant of the third power rail V3 of FIG. 1, are electrically coupled to the source/drain regions SD6 with less parasitic resistance than the embodiment of FIG. 1 using the third power rail V3 alone. The performance of the device implemented with the standard cell SC9 can be enhanced accordingly. In some embodiments, only one of the fourth power rail V4 and the fifth power rail V5 is provided.

Existing NAND circuits with enhanced performance using two interconnected first-type standard cells, e.g., the standard cells SC1 and SC2, may require duplicate metal lines MEI and duplicate metal lines MF3 to be electrically coupled to the source/drain regions in the respective N-type active regions (e.g., the N-type active regions NOD1 and NOD2 in FIG. 1). In contrast, due to the glued N-type active region NOD9, only one set of the metal lines MH and MF3 is required for the electrical interconnection. As a result, the layout space left unused due to the absence of the other set of the metal lines MH and MF3 can be utilized by the fourth power rail V4 and the fifth power rail V5. In some embodiments, the fourth power rail V4 and the fifth power rail V5 completely or partly overlap the N-type active region NOD9.

As described above, the power rails V4 and V5 are introduced to the standard cell SC9 for reducing parasitic resistance of the third power rail V3 for a NAND gate. This principle can also be applied to a standard cell implementing other types of logic gates, such as an inverter gate, an XOR gate, an AND gate, an And-Or-Inverter (AOI) gate, or other suitable logic gate devices.

Figure 7:
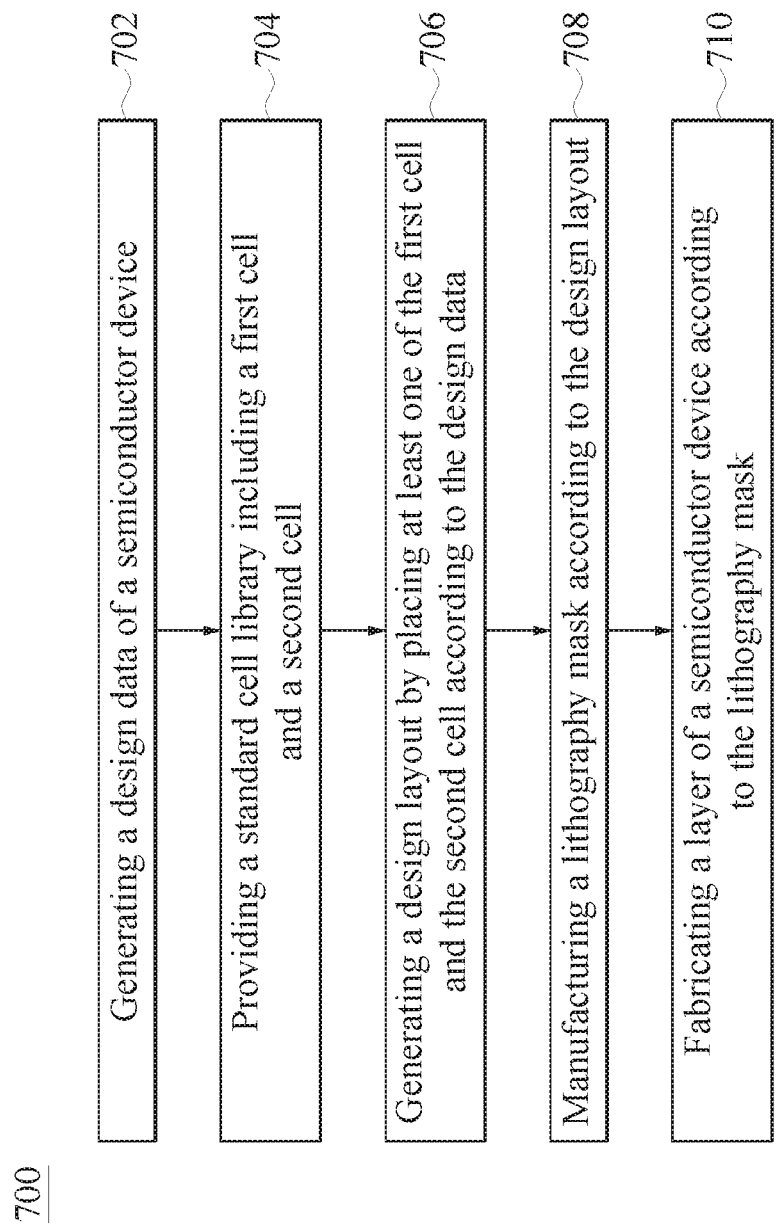
FIG. 7 is a flowchart of a layout method, in accordance with some embodiments.

FIG. 7 is a flowchart of a layout method 700, in accordance with some embodiments. At step 702, a design data of a semiconductor device is generated or received. The design data may be represented as a netlist, a schematic diagram, a circuit diagram or the like. In some embodiments, the semiconductor device includes at least one electronic circuit, which can be a logic gate device in various types, such as a NAND gate, an inverter gate, an XOR gate, an AND gate, a NOR gate, an AOI gate, or other suitable logic gate devices. In some embodiments, the design data in step 702 is generated during a synthesis stage of a design flow for manufacturing the semiconductor device.

At step 704, a standard cell library is provided which includes a first cell and a second cell. In some embodiments, the first cell is a first-type cell and the second cell is a second-type cell. The descriptions of the first-type and second-type cells are discussed previously and are not repeated for brevity.

At step 706, a design layout is generated by at least one of the first-type cell and the second-type cell according to the design data. The step 706 may be performed during a placement and routing stage of a design flow for manufacturing a semiconductor device.

At step 708, a lithography mask is manufactured according to the design layout. At step 710, a semiconductor device fabricated in which a layer of the semiconductor device is formed according to the lithography mask. In some embodiments, the semiconductor device is fabricated according to the design layout.

Figure 8A:
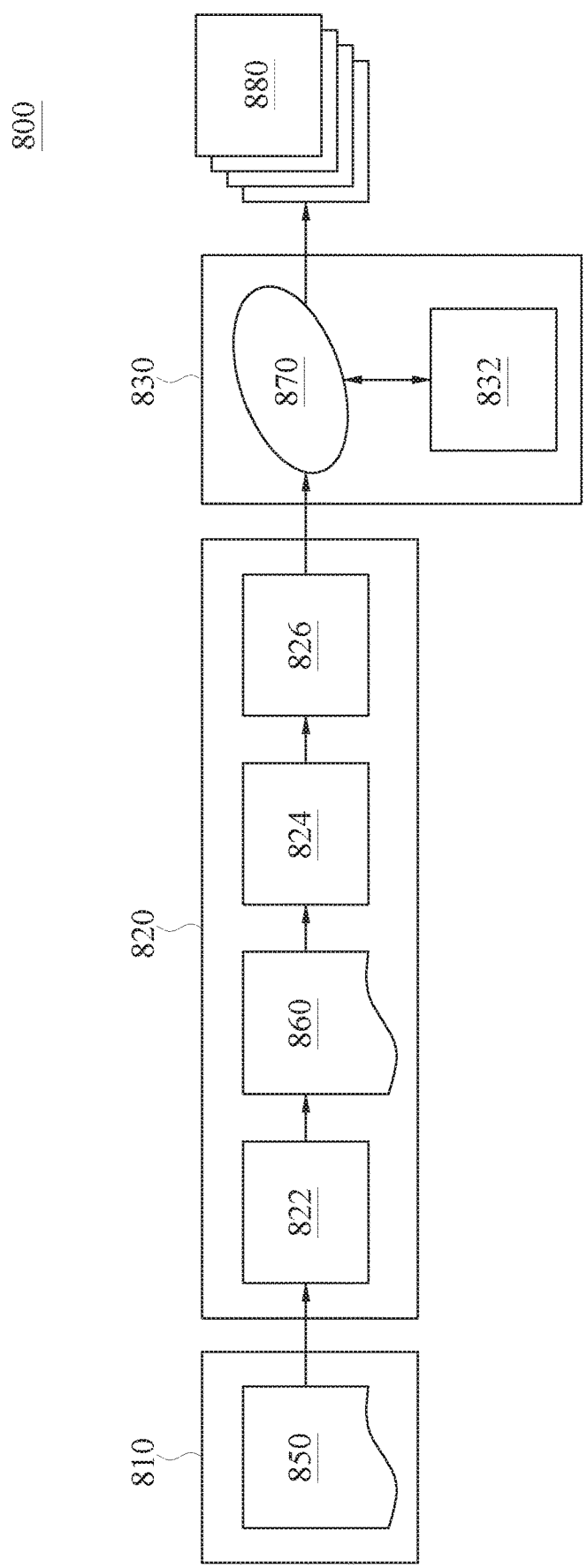
FIG. 8A is a schematic diagram showing an integrated circuit (IC) manufacturing system, in accordance with some embodiments.

FIG. 8A is a schematic diagram 800 showing an integrated circuit (IC) manufacturing system, in accordance with some embodiments. The IC manufacturing system 800 is configured to manufacture an IC device 880 through a plurality of entities, such as a design subsystem 810, a mask subsystem 820, and a fabrication subsystem 830. The entities in the IC manufacturing system 800 may be linked by a communication channel, e.g., a wired or wireless channel, and interact with one another through a network, e.g., an intranet or the Internet. In an embodiment, the design subsystem 810, the mask subsystem 820 and the fabrication subsystem 830 belong to a single entity, or are operated by independent parties.

The design subsystem (design house or layout design provider) 810 generates a design layout 850 in a design phase for the IC devices 880 to be fabricated. The design subsystem 810 may perform the layout methods discussed in the present disclosure to generate the design layout 850, e.g., the design layouts shown with reference to the figures of the present disclosure. In an embodiment, the design subsystem 810 operates a circuit design procedure to generate the design layout 850. The design subsystem 810 may include further one or more steps, such as logic design, physical design, pre-layout simulation, placement and routing, timing analysis, parameter extraction, design rule check and post-layout simulation, to generate the design layout 850. The design layout 850 may be converted from description texts into their visual equivalents to show a physical layout of the depicted patterns, such as the dimensions, shapes and locations thereof. In an embodiment, the design layout 850 can be expressed in a suitable file format such as GDSII, DFII, OASIS, or the like.

The mask subsystem 820 receives the design layout 850 from the design subsystem 810 and manufactures one or more masks (photomask, lithography masks or reticles) according to the design layout 850. In an embodiment, the mask subsystem 820 includes a mask data preparation block 822, a mask fabrication block 824 and a mask inspection block 826. The mask data preparation block 822 modifies the design layout 850 so that a revised design layout 860 can allow a mask writer to transfer the design layout 850 to a writer-readable format.

The mask fabrication block 824 is configured to fabricate the mask by preparing a substrate based on the design layout 860 provided by the mask data preparation block 822. A mask substrate is exposed to a radiation beam, such as an electron beam, based on the pattern of the design layout 860 in a writing operation, which may be followed by an etching operation to leave behind the patterns corresponding to the design layout 860. In an embodiment, the mask fabrication block 824 includes a checking procedure to ensure that the layout data 860 complies with requirements of a mask writer and/or a mask manufacturer to generate the mask as desired. An electron-beam (e-beam), multiple e-beams, an ion beam, a laser beam or other suitable writer source may be used to transfer the patterns.

After the lithography mask is fabricated, the mask inspection block 826 inspects the fabricated mask to determine if any defects, such as full-height and non-full-height defects, exist in the fabricated mask. If any defects are detected, the mask may be cleaned or the design layout in the mask may be modified.

The fabrication subsystem 830 is an IC manufacturing entity that includes multiple manufacturing facilities or tools for the fabrication of a variety of the IC devices 880. The fabrication subsystem 830 uses the mask fabricated by the mask subsystem 820 to fabricate a wafer 870 having a plurality of IC devices 880 thereon. The wafer 870 includes a semiconductor substrate and optionally various layers formed thereon. The operations provided by the manufacturing facilities or tools may include, but not limited to, photolithography, deposition, sputtering, etching, diffusion, ion implantation and annealing. In some embodiments, test structures may be formed on the wafer 870 to generate test data indicative of the quality of the fabricated wafer 870. In an embodiment, the fabrication subsystem 830 includes a wafer testing block 832 configured to ensure that the wafer 870 conforms to physical manufacturing specifications and mechanical and/or electrical performance specifications. After the wafer 870 passes the testing procedure performed by the wafer testing block 832, the wafer 870 may be diced (or sliced) along the scribe line regions to form separate IC devices 880. The dicing process can be accomplished by scribing and breaking, by mechanical sawing (e.g., with a dicing saw) or by laser cutting.

FIG. 8B is a schematic diagram of the design subsystem 810 in the IC manufacturing system 800 shown in FIG. 8A for generating or storing the design layouts discussed above, in accordance with some embodiments. In some embodiments, the design subsystem 810 is a computer system. The design subsystem 810 includes a processor 812, a network interface 814, an input and output (IWO) device 816, a storage device 817, a memory 819, and a bus 818. The bus 818 couples the network interface 814, the I/O device 816, the storage device 817, the memory 819 and the processor 812 to each other.

The processor 812 is configured to execute program instructions that include a tool configured to generate the design layouts as described and illustrated with reference to figures of the present disclosure.

The network interface 814 is configured to access program instructions and data accessed by the program instructions stored remotely through a network (not shown).

The I/O device 816 includes an input device and an output device configured for enabling user interaction with the system 810. In some embodiments, the input device includes, for example, a keyboard, a mouse, and other devices. Moreover, the output device includes, for example, a display, a printer, and other devices.

The storage device 817 is configured for storing the design layouts, program instructions and data accessed by the program instructions. In some embodiments, the storage device 817 includes a non-transitory computer-readable storage medium, for example, a magnetic disk and an optical disk.

The memory 819 is configured to store program instructions to be executed by the processor 812 and data accessed by the program instructions. In some embodiments, the memory 819 includes any combination of a random access memory (RAM), some other volatile storage device, a read-only memory (ROM), and some other non-volatile storage device.

According to an embodiment, a semiconductor device includes a first power rail and a second power rail extending in a row direction, a third power rail extending in the row direction between the first and second power rail, and a first cell arranged between the first power rail and the second power rail, wherein a cell height of the first cell in a column direction perpendicular to the row direction is equal to a pitch between the first power rail and the second power rail. The semiconductor device also includes a second cell arranged between the first power rail and the third power rail, wherein a cell height of the second cell in the column direction is equal to a pitch between the first power rail and the third power rail. A first active region of the first cell includes a first width in the column direction greater than a second width, in the column direction, of a second active region in the second cell.

According to an embodiment, a semiconductor device includes a plurality of first power rails extending in a row direction and configured to supply a first voltage, and a plurality of second power rails extending in the row direction, alternating with the first power rails, and configured to supply a second voltage different from the first voltage. The semiconductor device also includes a first cell, wherein a cell height of the first cell in the column direction is equal to a distance between two adjacent first power rails, wherein the first cell includes a first active region overlapping one of the second power rails between the two adjacent first power rails.

According to an embodiment, a method of manufacturing a semiconductor device includes: generating a design data of the semiconductor device; providing a standard cell library including a first cell and a second cell; and generating a design layout by placing at least one of the first cell and the second cell according to the design data. The design layout includes a first power rail and a second power rail extending in a row direction, and a third power rail extending in the row direction between the first and second power rails. The first cell is arranged between the first power rail and the second power rail, wherein a cell height of the first cell in a column direction perpendicular to the row direction is equal to a pitch between the first power rail and the second power rail. The second cell is arranged between the first power rail and the third power rail, wherein a cell height of the second cell in the column direction is equal to a pitch between the first power rail and the third power rail. A first active region of the first cell includes a first width in the column direction greater than a second width, in the column direction, of a second active region in the second cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
 a first power rail and a second power rail extending in a row direction;
 a third power rail extending in the row direction between the first and second power rails;
 a first cell arranged between the first power rail and the second power rail, wherein a cell height of the first cell in a column direction perpendicular to the row direction is equal to a pitch between the first power rail and the second power rail;

a second cell arranged between the first power rail and the third power rail, wherein a cell height of the second cell in the column direction is equal to a pitch between the first power rail and the third power rail; and a dummy fin structure disposed adjacent to the first cell and the second cell, the dummy fin structure extending in the row direction and overlapped with the third power rail, wherein the dummy fin structure is configured as a non-functional device, wherein a first active region of the first cell includes a first width in the column direction greater than a second width, in the column direction, of a second active region in the second cell.

2. The semiconductor device according to claim 1, wherein the first width is greater than twice the second width.

3. The semiconductor device according to claim 1, wherein the first and second power rails are configured to supply a first voltage and the third power rail is configured to supply a second voltage different from the first voltage.

4. The semiconductor device according to claim 1, wherein the first cell further comprises two third active regions, on opposite sides of the first active region, the third active regions having a conductivity opposite to that of the first active region.

5. The semiconductor device according to claim 4, wherein one of the third active regions is aligned with the second active region in the row direction.

6. The semiconductor device according to claim 4, wherein the first cell further comprises an isolation structure separating the first active region from the third active regions.

7. The semiconductor device according to claim 1, further comprising a third cell between the second power rail and the third power rail, wherein the third cell comprises a fourth active region, and a distance between an upper side of the second active region and a lower side of the fourth active region in the column direction is substantially equal to the first width of the first active region.

8. The semiconductor device according to claim 1, wherein the third power rail and the first active region intersect.

9. The semiconductor device according to claim 1, wherein the first cell further comprises a fourth power rail extending in the row direction and overlapping the first active region, the third and fourth power rails are configured to supply a same voltage.

10. The semiconductor device according to claim 1, wherein the first cell further comprises a first and a second fin structures extending in the row direction in the first active region and configured to form one or more field-effect transistors.

11. The semiconductor device according to claim 10, wherein the second cell further comprises a third fin structure extending in the row direction in the second active region and configured to form one or more field-effect transistors, the third fin structure aligned with the first fin structure in the row direction.

12. The semiconductor device according to claim 10, wherein the dummy fin structure is arranged on a side of the second cell, and the dummy fin structure is aligned with the second fin structure in the row direction.

13. A semiconductor device, comprising:

a plurality of first power rails extending in a row direction and configured to supply a first voltage;

a plurality of second power rails extending in the row direction, alternating with the first power rails and configured to supply a second voltage different from the first voltage;

a first cell, wherein a cell height of the first cell in a column direction perpendicular to the row direction is equal to a distance between two adjacent first power rails, wherein the first cell includes a first active region overlapping one of the second power rails between the two adjacent first power rails; and a dummy fin structure extending in the row direction and adjacent to the first cell, the dummy fin structure overlapped with one of the second power rails, wherein the dummy fin structure is electrically isolated from other features in the semiconductor device.

14. The semiconductor device according to claim 13, wherein the first cell comprises a second active region separated from the first active region, the first active region has a first width in the column direction greater than a second width of the second active region in the column direction, and the first active region includes a first conductivity opposite to a second conductivity of the second active region.

15. The semiconductor device according to claim 14, further comprising a second cell defined by one of the first power rails and an adjacent second power rail, the second cell comprising a third active region having the second conductivity and the second width in the column direction.

16. The semiconductor device according to claim 15, wherein the third active region is aligned with the second active region in the row direction.

17. The semiconductor device according to claim 13, wherein the first active region is symmetric with respect to the overlapping second power rail.

18. The semiconductor device according to claim 13, further comprising a third power rail extending in the row direction and electrically coupled to the first active region.

19. A method of manufacturing a semiconductor device, comprising:

generating a design data of the semiconductor device;

providing a standard cell library including a first cell and a second cell; and generating a design layout by placing at least one of the first cell and the second cell according to the design data, wherein the design layout comprises:

a first power rail and a second power rail extending in a row direction; and a third power rail extending in the row direction between the first and second power rails, wherein the first cell is arranged between the first power rail and the second power rail, wherein a cell height of the first cell in a column direction perpendicular to the row direction is equal to a pitch between the first power rail and the second power rail, wherein the second cell is arranged between the first power rail and the third power rail, wherein a cell height of the second cell in the column direction is equal to a pitch between the first power rail and the third power rail, wherein a first active region of the first cell includes a first width in the column direction greater than a second width, in the column direction, of a second active region in the second cell, wherein the design layout further comprising:
- an active fin structure extending in the row direction and overlapping the first cell; and
- a dummy fin structure extending in the row direction adjacent to the first cell and the second cell, the dummy fin structure aligned with the active fin structure and overlapped with the third power rail, wherein the dummy fin structure is configured as a non-functional device.

20. The method according to claim 19, further comprising manufacturing a lithography mask according to the design layout.

\* \* \* \* \*